US 8,648,658 B2

(12) United States Patent
Brice

(10) Patent No.: US 8,648,658 B2
(45) Date of Patent: Feb. 11, 2014

(54) GENERATION OF PRE-DISTORTION COEFFICIENTS

(75) Inventor: James Brice, Cambridge (GB)

(73) Assignee: Nujira Limited (GB)

( * ) Notice: Subject to any disclaimer, the term of this patent is extended or adjusted under 35 U.S.C. 154(b) by 63 days.

(21) Appl. No.: 13/129,669

(22) PCT Filed: Nov. 16, 2009

(86) PCT No.: PCT/EP2009/065240
§ 371 (c)(1),
(2), (4) Date: Dec. 8, 2011

(87) PCT Pub. No.: WO2010/055161
PCT Pub. Date: May 20, 2010

(65) Prior Publication Data
US 2012/0154039 A1  Jun. 21, 2012

(30) Foreign Application Priority Data
Nov. 17, 2008 (GB) ................................. 0821016.3

(51) Int. Cl.
*H03F 1/26* (2006.01)
(52) U.S. Cl.
USPC ......................................................... 330/149
(58) Field of Classification Search
USPC ........................................ 330/149; 455/114.3
See application file for complete search history.

(56) References Cited

U.S. PATENT DOCUMENTS

| 6,356,146 B1 * | 3/2002 | Wright et al. ..................... 330/2 |
| 6,741,663 B1 | 5/2004 | Tapio et al. |
| 7,058,369 B1 * | 6/2006 | Wright et al. .............. 455/114.2 |
| 7,288,988 B2 | 10/2007 | Braithwaite |
| 7,395,033 B2 | 7/2008 | Kodani et al. |
| 2005/0195919 A1 | 9/2005 | Cova |
| 2008/0130788 A1 | 6/2008 | Copeland |

FOREIGN PATENT DOCUMENTS

| GB | 2 337 169 A | 11/1999 |
| WO | 0108296 A1 | 2/2001 |
| WO | 2007117189 A1 | 10/2007 |

OTHER PUBLICATIONS

British Patent Office, "British Office Action for British International Application No. GB 08210163", Dated: Mar. 17, 2009, Publisher: British Intellectual Property Office, Published in: GB.
Officer: Jules Van Den Doel, "International Search and Written Opinion for International Application No. PCT/EP2009/065240", Dated: Feb. 22, 2010, Publisher: EPO, Published in: EP.
Van Den Doel, Jules, "PCT Application No. PCT/EP2009/065240 International Preliminary Report on Patentability May 26, 2011", , Publisher: PCT, Published in: PCT.
Van Den Doel, Jules, "EP Application No. 09 795 942.3 Office Action Apr. 25, 2012", , Publisher: EPO, Published in: EP.

* cited by examiner

*Primary Examiner* — Steven J Mottola
(74) *Attorney, Agent, or Firm* — Kaplan Breyer Schwarz & Ottensen, LLP

(57) ABSTRACT

There is disclosed a method for generating pre-emphasis coefficients for a pre-emphasis stage of a non-linear distorting device, the method comprising the steps of: capturing, for a given time period, samples of an input signal and samples of an output signal; determining the direction of an error between the captured samples; adjusting the input signal in a direction to reduce the error to generate an estimate of the pre-distorted input signal; generating updated pre-distortion coefficients in dependence on the estimate of the pre-distorted input signal and generated pre-distortion coefficients for one or more previous time periods.

15 Claims, 2 Drawing Sheets

GENERATION OF PRE-DISTORTION COEFFICIENTS

FIELD OF THE INVENTION

The invention is related to the generation of distortion coefficients for a pre-distortion stage of a non-linear distorting device, such as a power amplifier.

BACKGROUND OF THE INVENTION

It is well-known in the art that certain devices that process signals cause distortion of the signals between an input and an output. Distortion can be linear or non-linear.

It is known in the art to address issues of distortion by applying pre-distortion to a signal, which pre-distortion is an estimate of the inverse of the distortion effect. In this way the effect of distortion can be countered.

Linear distortion can be dealt with relatively easily by applying pre-distortion, as the linearity of the distortion allows the distortion to be accurately predicted, such that an effective pre-distortion can be applied.

Non-linear distortion is, however, more complicated to address, insofar as the distortion is unpredictable and therefore difficult to model. In the prior art there are known algorithmic techniques for generating pre-distortion coefficients for a pre-distortion stage, which attempt to model the distortion.

Determining the required pre-distortion coefficients, particularly to counter both memory and non-memory effect distortions, is difficult to achieve in an adaptive manner.

Example methods for generating pre-distortion coefficients can be found in U.S. Pat. Nos. 6,118,335, 6,741,663, 6,570,910 and 6,798,843.

Prior art techniques can be slow and difficult to implement.

It is an aim of the invention to provide an improved technique for generating pre-distortion coefficients for pre-distortion of a signal to counter the effects of distortion.

SUMMARY OF THE INVENTION

In accordance with the invention there is provided a method for generating pre-emphasis coefficients for a pre-emphasis stage of a non-linear distorting device, the method comprising the steps of: capturing, for a given time period, samples of an input signal and samples of an output signal; determining the direction of an error between the captured samples; adjusting the input signal in a direction to reduce the error to generate an estimate of the pre-distorted input signal; generating updated pre-distortion coefficients in dependence on the estimate of the pre-distorted input signal and generated pre-distortion coefficients for one or more previous time periods.

The step of generating an intermediate estimate of pre-emphasis coefficients may comprise applying a pointwise function to the captured samples.

The pointwise function may be a least mean squares function.

The step of generating the pre-emphasis coefficients may comprise applying least mean squares Kalman filtering function.

The method may further comprise the step of determining a magnitude of the error between the captured samples, wherein the adjusting step is adapted to determine the size of the adjustment in dependence on the magnitude of the error.

The size of the adjustment may be reduced as the error is reduced.

The method may further comprise storing the generated pre-emphasis coefficients.

The steps may be iterative.

In a first iteration the step of generating the pre-emphasis coefficients may be dependent only on the adjusted intermediate estimate.

The non-linear distorting device may be a power amplifier.

The pre-emphasis coefficients may be Volterra coefficients.

In an aspect a computer program may be adapted to perform the method as defined.

In an aspect a computer program product may be adapted to store computer program code for performing the method as defined.

In an aspect the invention provides an arrangement for generating pre-emphasis coefficients for a pre-emphasis stage of a non-linear distorting device, comprising: means for capturing, for a given time period, samples of an input signal and samples of an output signal; means for generating an intermediate estimate of pre-emphasis coefficients in dependence on the captured samples; means for determining the direction of an error between the captured samples; means for adjusting the intermediate estimate of the pre-emphasis coefficients in a direction to reduce the error; means for generating the pre-emphasis coefficients in dependence on the adjusted intermediate estimate of the pre-emphasis coefficients and the generated pre-emphasis coefficients for one or more previous time periods.

The non-linear distorting device may be a power amplifier.

BRIEF DESCRIPTION OF THE DRAWINGS

The invention will now be described with reference to the accompanying drawings in which.

DETAILED DESCRIPTION

The present invention is now described by way of example with reference to exemplary embodiments. One skilled in the art will appreciate that embodiments are described for ease of understanding the invention, and the invention is not necessarily limited to details of any embodiment described.

Figure 1:
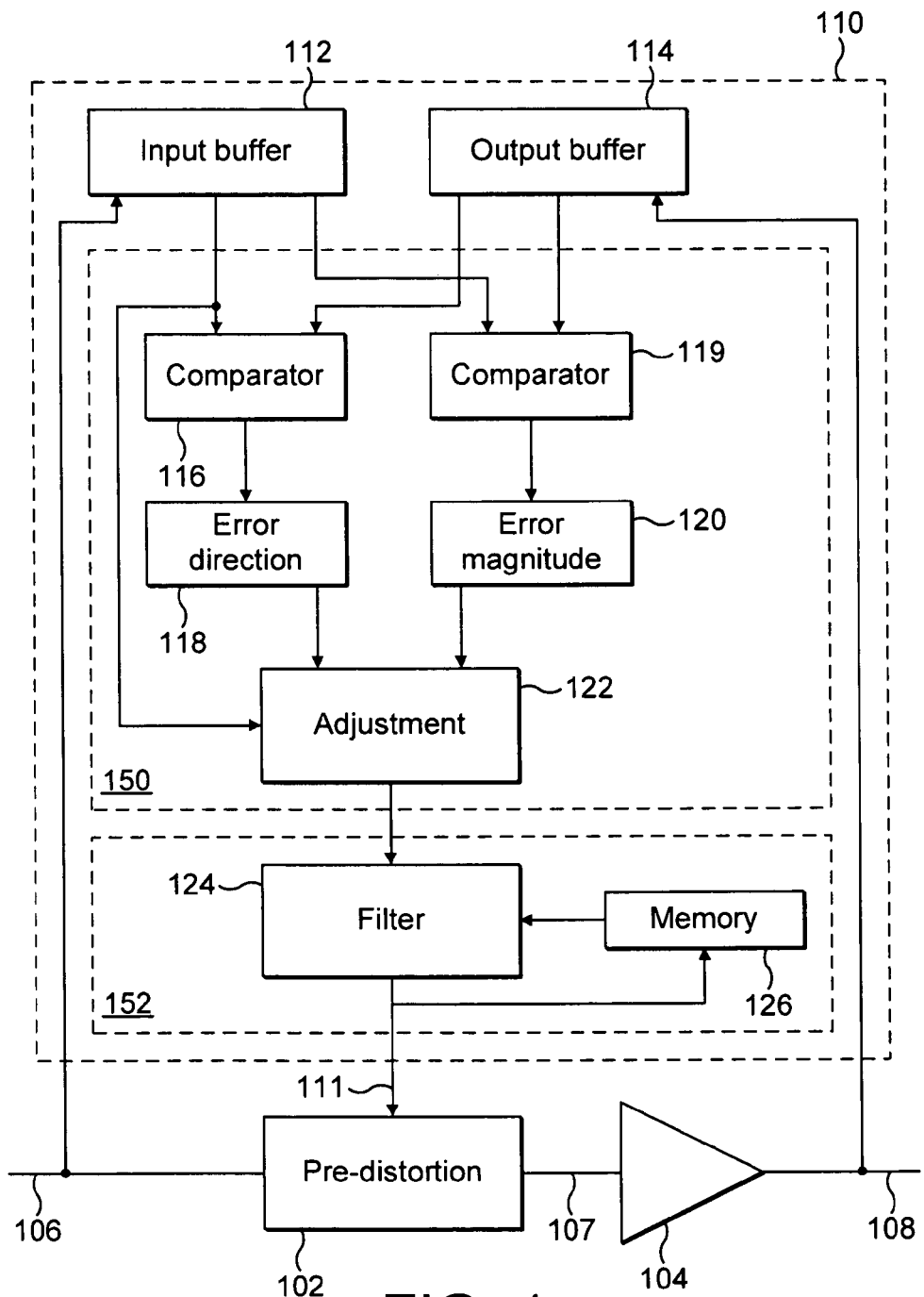
FIG. 1 illustrates schematically the functional blocks required in an exemplary implementation of the invention.

With reference to FIG. 1 there is illustrated schematically the functional blocks required for an exemplary implementation of the invention. A pre-distortion coefficient generation block 110 comprises an input buffer 112; an output buffer 114; a first stage 150 including comparator blocks 116 and 119, an error-direction functional block 118, an error-magnitude functional block 120, an adjustment functional block 122, and a memory 154; and a second stage 152 including a filter 124, and a memory 126.

In addition there is shown in FIG. 1 a pre-distortion block 102 and a non-linear device 104, for example a power amplifier.

An input signal for the non-linear device 104 is provided on line 106, and is connected to the input of the pre-distortion stage 102. The input signal on line 106 is the undistorted input signal. An output of the pre-distortion stage on line 107 forms an input to the non-linear device 104. The signal on line 107 is the pre-distorted input signal. The output of the non-linear device 104 is provided on line 108.

In general, the pre-distortion stage 102 applies a pre-distortion to the input signal for the non-linear device 104 to compensate for distortion in that device, such that any distortion on the output of the non-linear device is reduced or minimised.

In this description, the function which is intended to remove distortion caused by a subsequent stage is referred to as pre-distortion function, this function being carried out in a functional block referred to as the pre-distortion block. This pre-distortion may also be referred to as pre-emphasis: an emphasis or weighting applied to the signal to counter-act a subsequent distortion.

The first input to the pre-distortion coefficient generation stage 110 is provided by the input signal to the pre-distortion stage 102 on line 106. In an alternative the input to the buffer 112 may be provided by a reference signal representing the input signal on line 106. The second input is provided by the output signal from the non-linear device 104 on line 108. The output of the pre-distortion coefficient generation stage 110 is provided on line 111 as an input to the pre-distortion stage 102.

In general, the coefficient generation block 110 receives as a first input a signal representative of the input to the non-linear device, and as a second input a signed representative of the output of the non-linear device.

Figure 2:
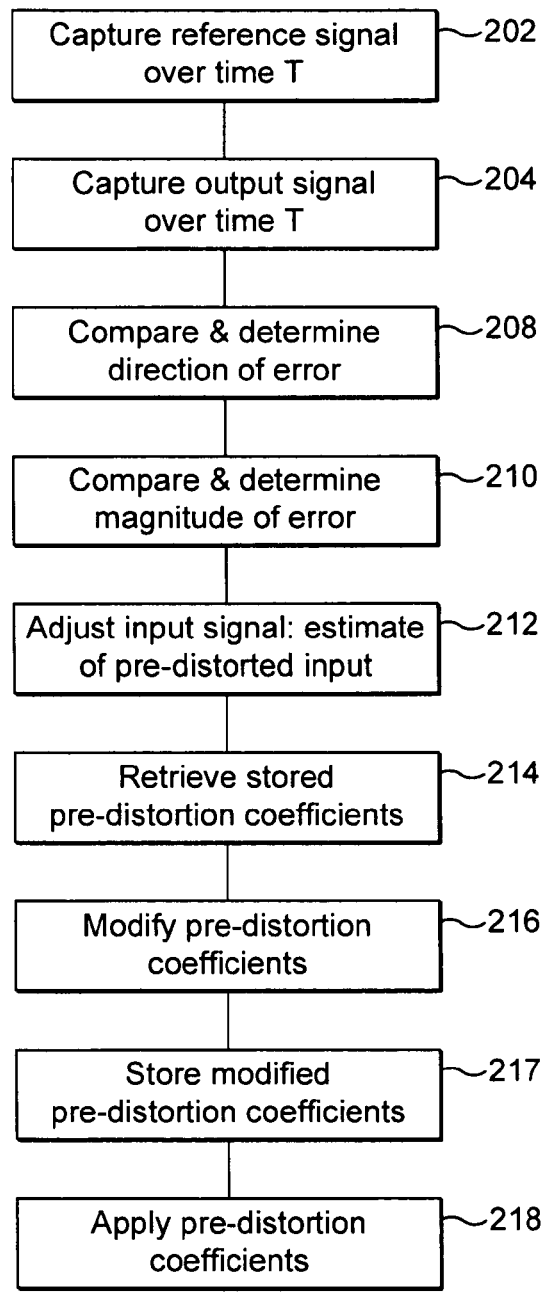
FIG. 2 illustrates the process steps in an exemplary implementation of the present invention.

The operation of the exemplary pre-emphasis coefficient generation block 110 is now described with further reference to FIG. 1 and with reference also to the exemplary process steps of FIG. 2.

The input buffer 112 receives the input signals on line 106, and buffers these signals. In this way, as denoted by step 202 of FIG. 2, a portion or sample of the input signal over a time period T can be captured. The buffer 112 may be sized to store a portion of the input signal over a period greater than time period T, but is in any event adapted to provide at its output a portion of the input signal over time period T.

The output buffer 114 receives the output signals on line 108, and buffers these signals. In this way, as denoted by step 204 of FIG. 2, a portion or sample of the output signal over the time period T can be captured. The buffer 114 may be sized to store a portion of the output signal over a period greater than time period T, but is in any event adapted to provide at its output a portion of the output signal over time period T.

The output samples captured are synchronised to the input samples captured over time period T for further processing. Thus to compensate for time delays in the pre-distortion block 102 and the non-linear device 104, the input samples may be delayed by an appropriate amount.

These two captures, in steps 202 and 204, can be defined as follows:

$\text{ref}_n$—the N samples captured from the input (reference) signal on line 106 (where n ranges from 1 to N)

$\text{out}_n$—the corresponding (synchronised) N samples captured from the output signal on line 108.

The outputs of the input and output buffers 112 and 114 are provided as inputs to the comparators 116 and 119 respectively. Thus the comparator blocks 116 respectively receive captured or sampled portions of each of the input signal and output signal over a synchronised time period T.

The comparators 116 and 119, in combination with the error direction and error magnitude blocks 118 and 120, generate an estimate of how the transmitted signal, in a point-by-point (pointwise) manner, could be updated so that, when pre-distortion is applied, the resulting signal will match the required signal more closely.

The implementation of the pointwise function is as an LMS function in a preferred arrangement. However other pointwise functions may be used in alternative arrangements.

An intermediate estimate of the pre-distortion obtained from the first stage 150 provides an estimate for a distortion over time T, not the overall distortion.

The pointwise outputs of the error detection and error magnitude blocks 118 and 120 provide pointwise information identifying the direction and size of the error between the input signal and output signal over time period T.

As denoted by step 208 of FIG. 2, the determine error direction functional block 118 operates in combination with the comparator 116 to determine a direction of an error between the captured or sampled portions of each of the input signal and output signal over the time period T. The resulting direction information is provided as a pointwise output. Preferably a least mean square (LMS) technique is used to determine this information.

As denoted by step 210 of FIG. 2, the determine magnitude of error functional block 120 operates in combination with the comparator 119 to determine a magnitude of an error between the captured or sampled portions of each of the input signal and output signal over the time period T. The resulting magnitude information is provided as a pointwise output. Preferably a least mean square (LMS) technique is used to determine this information.

The direction and preferably the magnitude of the error determined in steps 208 and 210 can simultaneously be represented by:

$$\text{err}_n = \text{out}_n - \text{ref}_{in}$$

The direction is simply the phase of $\text{err}_n$, and the magnitude is the amplitude of $\text{err}_n$.

The step of determining the magnitude of the error is optional.

The first stage 150 of the exemplary pre-emphasis coefficient generation block 110 thus does not determine values for intermediate estimates of the pre-emphasis coefficients. Rather they are used to determine additional information for further processing steps.

The adjustment functional block 122 receives the pointwise outputs of the error direction and error magnitude blocks 118 and 120. The adjustment block 122 additionally receives the input signal in buffer 112.

As denoted by step 212 of FIG. 2, the adjustment block 122 adjusts the input signal in dependence on the direction of error information and, optionally, the magnitude of error information.

If the pre-distorted copy of the reference signal on line 107 is defined as $\text{pre}_n$ then a simple estimate of the adjusted "pre-distortion input" generated in step 212 can be represented as follows:

$$\text{in}_n = \text{pre}_n - \text{err}_n$$

The direction of error information is used by the adjustment block 122 to adjust the input signal against the direction of the error. Thus if the error information denotes that too much distortion is being applied, then the points of the pointwise input signal are adjusted to reduce the distortion applied.

In accordance with the principles of the present invention, neither the absolute values of the input signal, nor the absolute size of the error, are determined. The input signal is simply adjusted in dependence on the error. The amplitude and phase of the pointwise samples of the input signal for the time period T, are simply increased or decreased in accordance with information concerning the direction of the error.

The signal being a digital pointwise signal, it is preferably adjusted stepwise in a single step. Thus if the error information indicates the distortion is too large, they are reduced by a single step adjustment.

In this way an intermediate estimate of the pre-distorted input signal to be applied is provided at an output of the adjustment functional block 122 for processing by the second stage 152.

The output of the first stage 150, provided by the adjustment block 122, is thus a pointwise (point-by-point) intermediate estimate of the pre-distorted input signal.

The optional information concerning the magnitude of the error may be used by the adjustment block 122 to adjust the step size or number of steps by which the input signal is adjusted to generate the pre-distorted estimate. Thus the magnitude of the adjustment may be dependent upon the magnitude of the error. This does not necessarily require determination of a value representing the size of the error: a comparator operation may determine whether the error is above or below one or more thresholds, which thresholds are associated with one or more step sizes or numbers of steps.

The pointwise values of the adjusted intermediate estimate of the pre-distorted signal is then provided as an input to the filter 124 of the second stage 152.

As denoted by step 214, the filter 124 also retrieves stored information representing the previous estimate of the pre-distortion coefficients from the memory 126.

The filter 124 is preferably a Kalman filter. The Kalman filter processes the pointwise intermediate estimate of the pre-distorted input signal for the time period T provided by the adjustment block 122 and the retrieved information representing the previous pre-distortion coefficients over one or more previous time periods T, to generate an updated estimate of the pre-distortion coefficients on output line 111. This processing is represented in step 216.

In the exemplary arrangement described, the updated estimate of the pre-emphasis coefficients are then stored in the Kalman filter memory 126, as denoted by step 217.

The pre-emphasis coefficients to be applied in the pre-distortion stage 102 are then provided on line 111. As denoted by step 218, these coefficients are applied in the pre-distortion block 102.

The steps 214, 216, 217 and 218 can be exemplified as follows.

By choosing a simple Volterra model for the pre-distortion (with order K, and memory depth Q), the following can be defined:

$\alpha_{k,q}$—the pre-distortion coefficients retrieved in step 214 (where k ranges from 0 to K, and q ranges from 0 to Q).

These modified pre-distortion coefficients can be used to pre-distort the reference signal in step 218 as represented by the following relationship:

$$pre_n = \sum_{q=0}^{Q} \sum_{k=0}^{K} \alpha_{k,q} \cdot ref_{n-q} \cdot |ref_{n-q}|^k$$

The preceding relationship defines how the pre-distortion coefficients from the previous iteration are used to modify the reference signal.

In order to modify the pre-distortion coefficients from the previous iteration in step, a least squares problem can be constructed which includes both: equations demonstrating that pre-distorting $ref_n$ using the resulting coefficients should be as close as possible to $in_n$; and equations stating that the resulting coefficients should be as close as possible to the stored coefficients. The stored coefficients can be defined to be the vector $\alpha^{stored}$, and their variance to be the matrix $V^{stored}$. The least squares solution can then be defined as:

$$A \cdot \alpha = b + \text{noise} \quad \text{var(noise)} = V$$

where:

$$A = \begin{pmatrix} ref_1 & ref_1|ref_1| & \cdots & ref_1|ref_1|^K & ref_{1-1} & ref_{1-1}|ref_{1-1}| & \cdots & ref_{1-1}|ref_{1-1}|^K & \cdots & ref_{1-Q} & ref_{1-Q}|ref_{1-Q}| & \cdots & ref_{1-Q}|ref_{1-Q}|^K \\ ref_2 & ref_2|ref_2| & \cdots & ref_2|ref_2|^K & ref_{2-1} & ref_{2-1}|ref_{2-1}| & \cdots & ref_{2-1}|ref_{2-1}|^K & \cdots & ref_{2-Q} & ref_{2-Q}|ref_{2-Q}| & \cdots & ref_{2-Q}|ref_{2-Q}|^K \\ \vdots & \vdots & \ddots & \vdots & \vdots & \vdots & \ddots & \vdots & \ddots & \vdots & \vdots & \ddots & \vdots \\ ref_N & ref_N|ref_N| & \cdots & ref_N|ref_N|^K & ref_{N-1} & ref_{N-1}|ref_{N-1}| & \cdots & ref_{N-1}|ref_{N-1}|^K & \cdots & ref_{N-Q} & ref_{N-Q}|ref_{N-Q}| & \cdots & ref_{N-Q}|ref_{N-Q}|^K \\ 1 & 0 & \cdots & 0 & 0 & 0 & \cdots & 0 & \cdots & 0 & 0 & \cdots & 0 \\ 0 & 1 & \cdots & 0 & 0 & 0 & \cdots & 0 & \cdots & 0 & 0 & \cdots & 0 \\ \vdots & \vdots & \ddots & \vdots & \vdots & \vdots & \ddots & \vdots & \ddots & \vdots & \vdots & \ddots & \vdots \\ 0 & 0 & \cdots & 0 & 0 & 0 & \cdots & 0 & \cdots & 0 & 0 & \cdots & 1 \end{pmatrix}$$

$$b = \begin{pmatrix} in_1 \\ in_2 \\ \vdots \\ in_N \\ \alpha_1^{stored} \\ \alpha_2^{stored} \\ \vdots \\ \alpha_{(K+1)(Q+1)}^{stored} \end{pmatrix}$$

$$V = \begin{pmatrix} 1 & 0 & \cdots & 0 & 0 & 0 & \cdots & 0 \\ 0 & 1 & \cdots & 0 & 0 & 0 & \cdots & 0 \\ \vdots & \vdots & \ddots & \vdots & \vdots & \vdots & \ddots & \vdots \\ 0 & 0 & \cdots & 1 & 0 & 0 & \cdots & 0 \\ 0 & 0 & \cdots & 0 & V_{1,1}^{stored} & V_{1,2}^{stored} & \cdots & V_{1,(K+1)\cdot(Q+1)}^{stored} \\ 0 & 0 & \cdots & 0 & V_{2,1}^{stored} & V_{2,2}^{stored} & \cdots & V_{2,(K+1)\cdot(Q+1)}^{stored} \\ \vdots & \vdots & \ddots & \vdots & \vdots & \vdots & \ddots & \vdots \\ 0 & 0 & \cdots & 0 & V_{(K+1)\cdot(Q+1),1}^{stored} & V_{(K+1)\cdot(Q+1),2}^{stored} & \cdots & V_{(K+1)\cdot(Q+1),(K+1)\cdot(Q+1)}^{stored} \end{pmatrix}$$

It can be noted that in the above equations, where zero or negative indices of ref are referred to, these samples correspond to the samples that passed through the power amplifier before ref.

The result of solving this problem in step 216 gives modified coefficients that both match the required pre-distortion, and which are also consistent with the pre-distortion chosen for the previous section of signal pre-distortion. This solution then becomes the new stored coefficients, defined as:

$$V^{new\ stored} = (A^\dagger \cdot V^{-1} \cdot A)^{-1}$$

$$\alpha^{new\ stored} = (A^\dagger \cdot V^{-1} \cdot A)^{-1} (A^\dagger \cdot V^{-1} \cdot b)$$

where $A^\dagger$ represents the Hermitian conjugate of A.

The Kalman filter is preferable. In general a filter is required to provide a new estimate based on an intermediate estimate and one or more prior estimates.

The filter of the second stage 152 is, in general, preferably a least squares mechanism to convert the point-by-point output of the first stage 150 into a set of pre-distortion coefficients. What makes it a "Kalman Filter", in the preferred arrangement, is that it remembers the previous estimate it had made of the coefficients, along with its confidence in that estimate, and uses this in the coefficient determination so that the resulting coefficients will eventually be applicable to any signal, rather than just the signal of time period T.

The process of FIG. 2 is preferably iterative. Thus on completion of the process over time period T, the process is repeated for subsequent time periods. The coefficients stored in the memory 126 for previous iterations allow an estimate for a current iteration to be improved.

In a first iteration, no prior coefficient estimates may be stored and thus an estimate may be based solely on the current captured signals. The memories 154 and 126 may initially be set with default preconfigured values.

The optional step of determining and using the magnitude of the error may allow for the step size of the step wise adjustment to be decreased over time as the estimate becomes more accurate over cumulative time periods.

The pointwise intermediate estimate of the pre-distortion in the first stage 150, and the estimate of the actual pre-distortion coefficients in the second stage, are preferably Volterra coefficients.

In an exemplary arrangement, therefore, the invention provides a simple pointwise least squares (LMS) algorithm with a least squares Kalman filter to estimate Volterra coefficients which can recreate a pre-distortion for a range of different signals. The pointwise LMS algorithm processes a section of the captured signal and updates the pre-distortion vector. The pre-distortion is characterised using Volterra coefficients, and combined with previous estimates of these coefficients (obtained from different sections of the captured signal) using the Kalman filter. The exemplary arrangement results in a set of coefficients that can successfully pre-distort almost any signal input to the non-linear device—not just the input signal upon which the coefficient estimation is based.

The invention applies to the generation of pre-distortion coefficients for a device or devices having non-linear distortion characteristics. An example of such a device is a power amplifier, but one skilled in the art will appreciate that there exist a multitude of such devices.

The invention has been described herein by way of reference to particular examples and embodiments, for the purposes of illustrating the invention and its embodiments. The invention is not limited to the specifics of any embodiment descried herein. Any feature of any embodiment may be implemented in combination with features of other embodiments, no embodiment being exclusive.

What is claimed is:

1. A method for generating pre-emphasis coefficients for a pre-emphasis stage of a non-linear distorting device, the method comprising the steps of:
    capturing, for a given time period, samples of an input signal and samples of an output signal;
    determining the direction of an error between the captured samples;
    adjusting the input signal in a direction to reduce the error to generate an estimate of the pre-distorted input signal; and
    generating updated pre-distortion coefficients in dependence on the estimate of the pre-distorted input signal and generated pre-distortion coefficients for one or more previous time periods.

2. The method of claim 1 wherein the step of adjusting the input signal to generate the estimate comprises applying a pointwise function to the captured samples.

3. The method of claim 2 wherein the pointwise function is a least mean squares function.

4. The method of claim 1 wherein the step of generating the pre-emphasis coefficients comprises applying least mean squares Kalman filtering function.

5. The method of claim 1 further comprising the step of determining a magnitude of the error between the captured samples, wherein the adjusting step is adapted to determine the size of the adjustment in dependence on the magnitude of the error.

6. The method of claim 5 wherein the size of the adjustment is reduced as the error is reduced.

7. The method of claim 1 further comprising storing the generated pre-emphasis coefficients.

8. The method of claim 1 wherein the steps are iterative.

9. The method of claim 8 wherein in a first iteration the step of generating the pre-emphasis coefficients is dependent only on the generated estimate.

10. The method of claim 1 wherein the non-linear distorting device is a power amplifier.

11. The method of claim 1 wherein the pre-emphasis coefficients are Volterra coefficients.

12. A computer program product embodied on a non-transitory medium and adapted to perform, when executed, the method of claim 1.

13. A non-transitory computer-readable storage medium for storing computer program code for performing, when executed, the method of claim 1.

14. An arrangement for generating pre-emphasis coefficients for a pre-emphasis stage of a non-linear distorting device, comprising:
- means for capturing, for a given time period, samples of an input signal and samples of an output signal;
- means for generating an intermediate estimate of pre-emphasis coefficients in dependence on the captured samples;
- means for determining the direction of an error between the captured samples;
- means for adjusting the intermediate estimate of the pre-emphasis coefficients in a direction to reduce the error; and
- means for generating the pre-emphasis coefficients in dependence on the adjusted intermediate estimate of the pre-emphasis coefficients and the generated pre-emphasis coefficients for one or more previous time periods.

15. The arrangement of claim 14 wherein the non-linear distorting device is a power amplifier.

* * * * *

UNITED STATES PATENT AND TRADEMARK OFFICE
CERTIFICATE OF CORRECTION

PATENT NO.        : 8,648,658 B2                                               Page 1 of 1
APPLICATION NO.   : 13/129669
DATED             : February 11, 2014
INVENTOR(S)       : James Brice It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 270 days.

Signed and Sealed this

Twenty-ninth Day of September, 2015

Michelle K. Lee
*Director of the United States Patent and Trademark Office*